United States Patent
Maejima et al.

(10) Patent No.: US 7,701,784 B2
(45) Date of Patent: Apr. 20, 2010

(54) SEMICONDUCTOR MEMORY DEVICE WHICH INCLUDES MEMORY CELL HAVING CHARGE ACCUMULATION LAYER AND CONTROL GATE

(75) Inventors: Hiroshi Maejima, Milpitas, CA (US); Makoto Hamada, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 11/934,304

(22) Filed: Nov. 2, 2007

(65) Prior Publication Data

US 2009/0116292 A1     May 7, 2009

(51) Int. Cl.
    *G11C 5/14*      (2006.01)
(52) U.S. Cl. ............................ 365/189.09; 365/185.25; 365/185.17
(58) Field of Classification Search ............ 365/185.25, 365/185.17, 189.09
See application file for complete search history.

(56) References Cited

U.S. PATENT DOCUMENTS

| | | | |
|---|---|---|---|
| 7,088,620 B2 | 8/2006 | Kawai et al. | |
| 2004/0080980 A1* | 4/2004 | Lee | 365/185.17 |
| 2007/0064495 A1* | 3/2007 | Shibata | 365/185.28 |

* cited by examiner

*Primary Examiner*—Hoai V Ho
*Assistant Examiner*—Jason Lappas
(74) *Attorney, Agent, or Firm*—Oblon, Spivak, McClelland, Maier & Neustadt, L.L.P.

(57) ABSTRACT

A semiconductor memory device includes a memory cell unit, word lines, a driver circuit, and a voltage generator. The memory cell unit includes a plurality of memory cells connected in series. Each of the memory cells includes a charge accumulation layer and a control gate. The word lines are connected to the control gate. The driver circuit selects one of the word lines and applies voltages to a selected word line and unselected word lines. The voltage generator includes first and second charge pump circuits and outputs a voltage generated by the first and second charge pump circuits to the driver circuit. The first charge pump circuit is exclusively used to generate a voltage for a first word line. The first word line is one of the unselected word lines located adjacent to the selected word line.

20 Claims, 15 Drawing Sheets

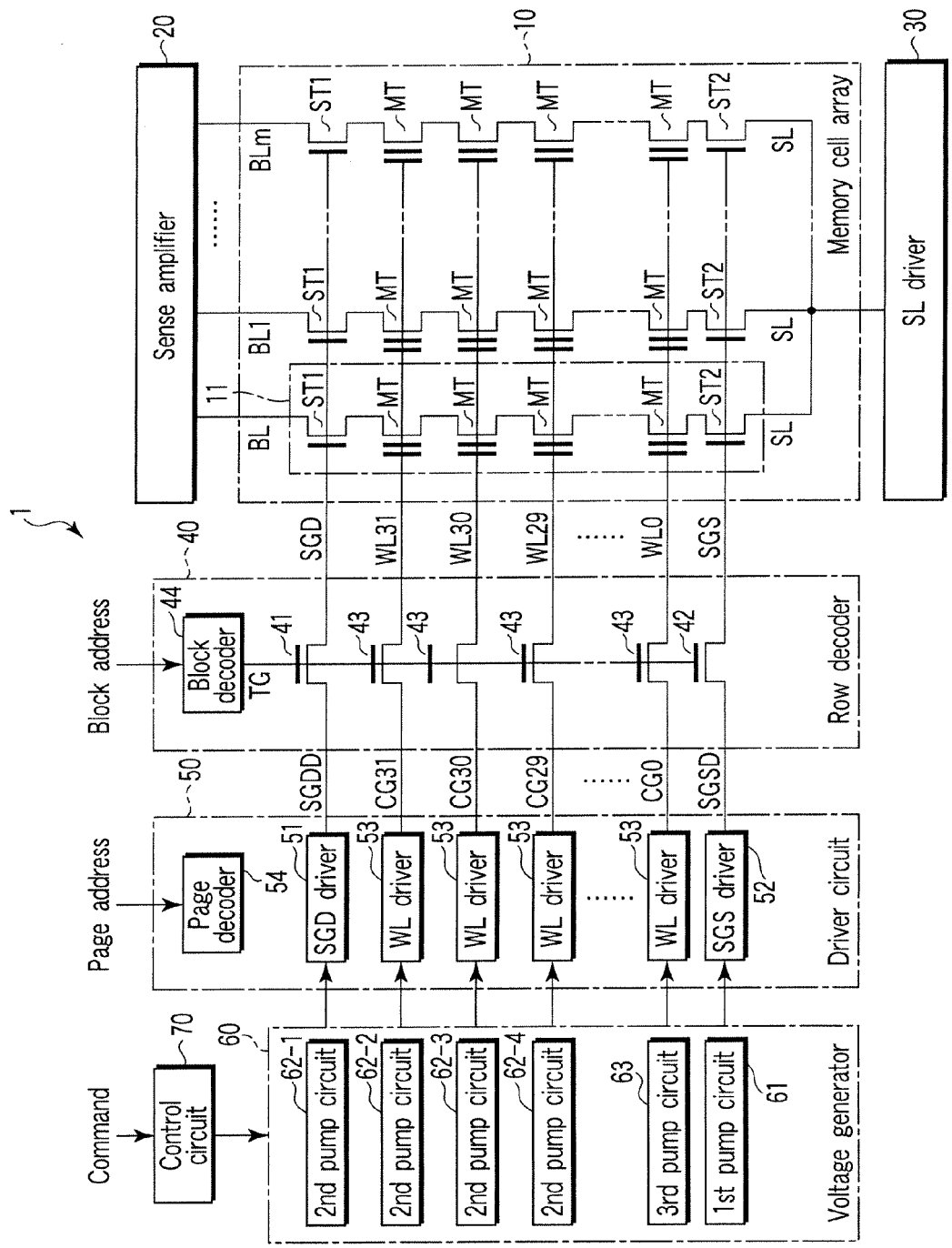
F I G. 1

|  | Program | Read |
|---|---|---|
| First charge pump | VPASSH | VREADLA |
| Second charge pump | VPASS (VPASSL) | VREAD |
| Third charge pump | VREADH | VREADH |
| Fourth charge pump | VPGM | VCGR |

FIG. 2

| WL \ OP | Program | Read |
|---|---|---|
| WLi (Selected) | VPGM | VCGR |
| WLi + 1 (Unselected) | VPASSH | VREADLA |
| Other WLs (Unselected) | VPASS | VREAD |
| | VPASSL | |
| | VGP | |
| | VISO | |

|  | Voltage |
|---|---|
| SGD | VSGD |
| WL31 | VPASS |
| WL (i+3)~WL30 | VPASS |
| WL (i+2) | VPASS |
| WL (i+1) | VPASSH |
| Selected → WLi | VPGM |
| WL (i−1) | VPASS |
| WL (i−2) | VPASS |
| WL (i−3)~WL1 | VPASS |
| WL0 | VPASS |
| SGS | 0V |

Program (VPGM>VPASSH>VPASS)

F I G. 8

|  | Voltage |
|---|---|
| SGD | VSG |
| WL31 | VREAD |
| WL (i+3)~WL30 | VREAD |
| WL (i+2) | VREAD |
| WL (i+1) | VREADLA |
| Selected → WLi | VCGR |
| WL (i−1) | VREAD |
| WL (i−2) | VREAD |
| WL (i−3)~WL1 | VREAD |
| WL0 | VREAD |
| SGS | VSG |

Read (VREAD>VREADLA, VCGR)

F I G. 9

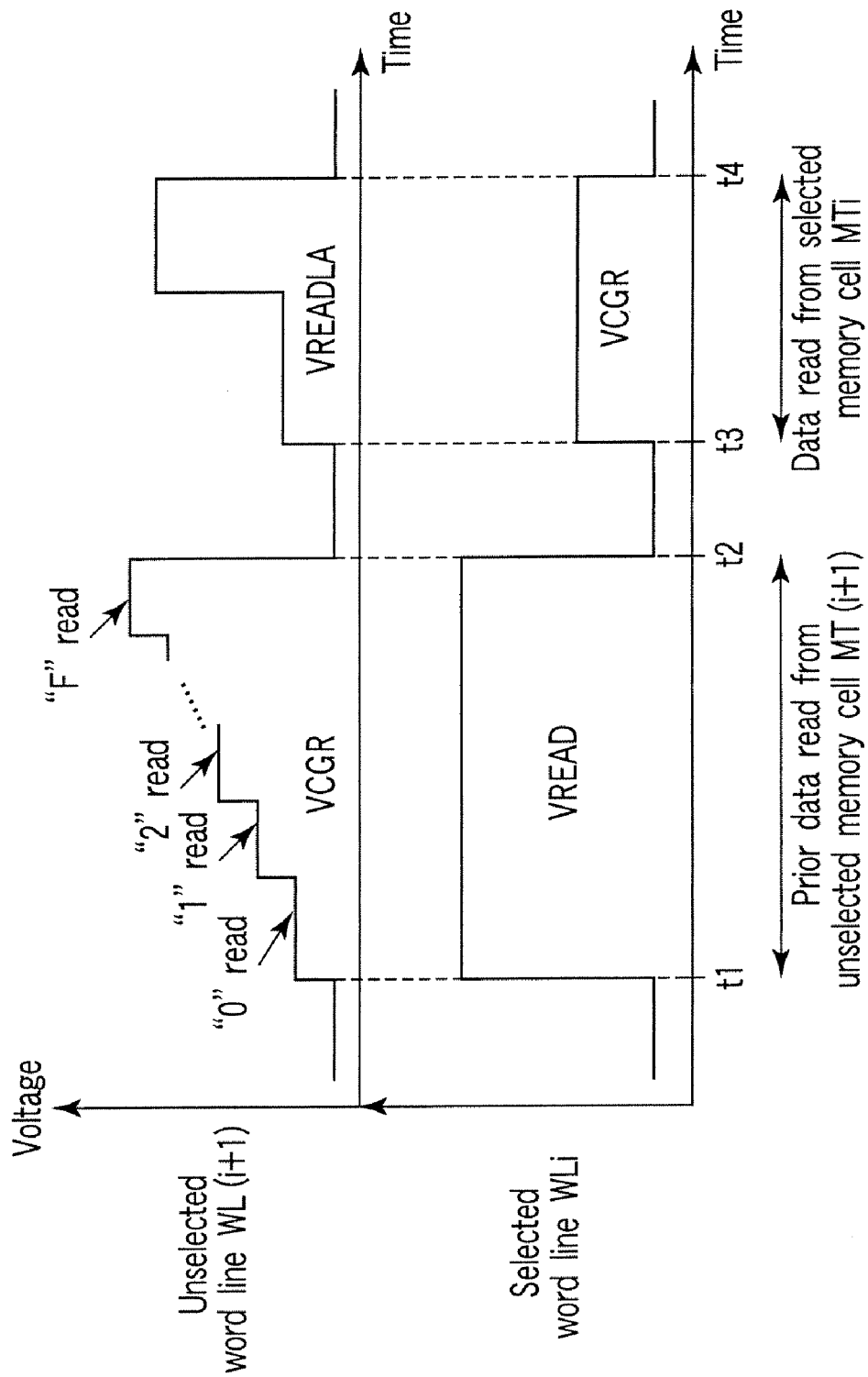
F I G. 10

CASE III

|  | Voltage |
|---|---|
| SGD | VSGD |
| WL31 | VPASS |
| WL (i+3)~WL30 | VPASS |
| WL (i+2) | VPASS |
| WL (i+1) | VPASS |
| Selected → WLi | VPGM |
| WL (i−1) | VPASSH |
| WL (i−2) | VPASS |
| WL (i−3)~WL1 | VPASS |
| WL0 | VPASS |
| SGS | 0V |

Program

F I G. 17

|  | Voltage |
|---|---|
| SGD | VSG |
| WL31 | VREAD |
| WL (i+3)~WL30 | VREAD |
| WL (i+2) | VREAD |
| WL (i+1) | VREAD |
| Selected → WLi | VCGR |
| WL (i−1) | VREADLA |
| WL (i−2) | VREAD |
| WL (i−3)~WL1 | VREAD |
| WL0 | VREAD |
| SGS | VSG |

Read

F I G. 18

|  | Voltage |
|---|---|
| SGD | VSGD |
| WL31 | VPASS |
| WL (i+3)~WL30 | VPASS |
| WL (i+2) | VPASS |
| WL (i+1) | VPASSH |
| Selected → WLi | VPGM |
| WL (i−1) | VPASSH |
| WL (i−2) | VPASS |
| WL (i−3)~WL1 | VPASS |
| WL0 | VPASS |
| SGS | 0V |

Program

F I G. 19

|  | Voltage |
|---|---|
| SGD | VSG |
| WL31 | VREAD |
| WL (i+3)~WL30 | VREAD |
| WL (i+2) | VREAD |
| WL (i+1) | VREADLA |
| Selected → WLi | VCGR |
| WL (i−1) | VREADLA |
| WL (i−2) | VREAD |
| WL (i−3)~WL1 | VREAD |
| WL0 | VREAD |
| SGS | VSG |

Read

F I G. 20

| | Voltage |
|---|---|
| SGD | VSGD |
| WL31 | VGP |
| WL(i+3)~WL30 | VPASS |
| WL(i+2) | VPASS |
| WL(i+1) | VPASSH |
| WLi (Selected) | VPGM |
| WL(i-1) | VPASS |
| WL(i-2) | VPASS |
| WL(i-3) | VPASS |
| WL(i-4) | VGP |
| WL(i-5) | VISO |
| WL(i-6) | VGP |
| WL1~WL(i-7) | VPASS |
| WL0 | VGP |
| SGS | 0V |
Program
F I G. 21
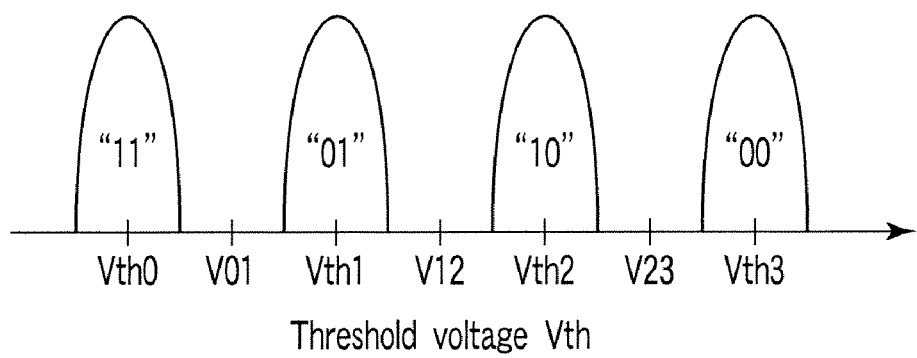
F I G. 22

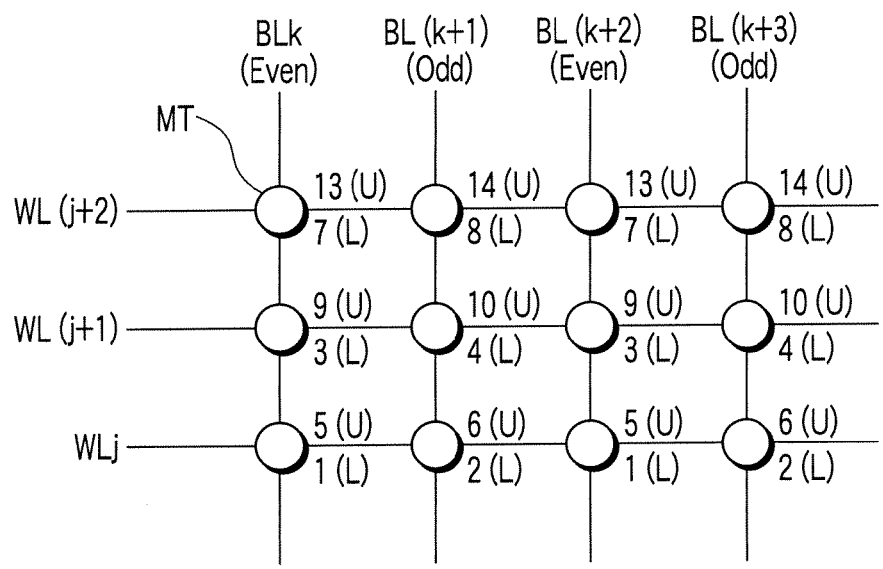
F I G. 25
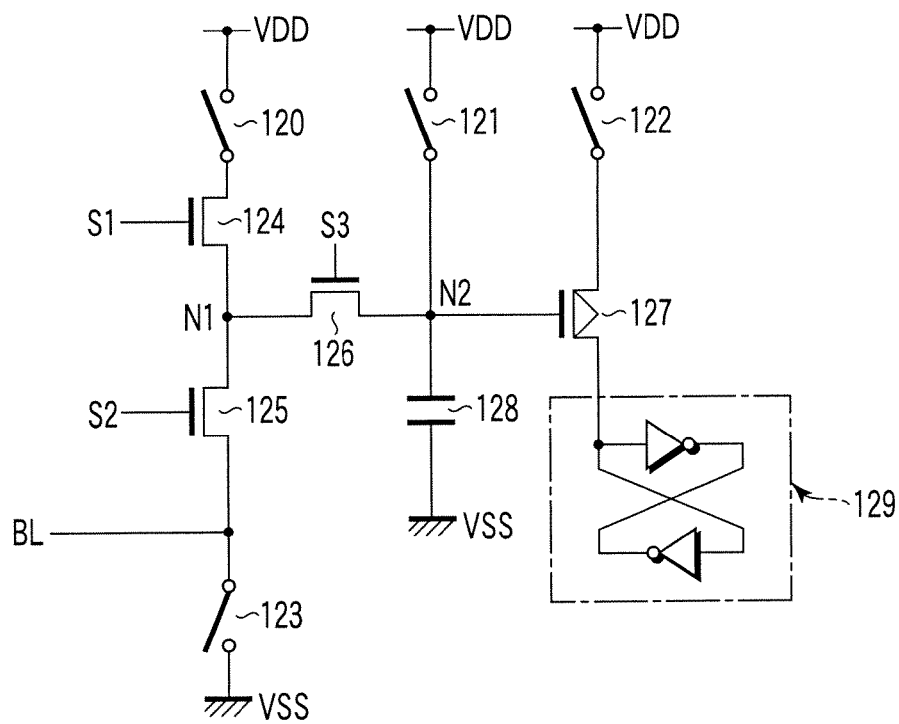
S/A
F I G. 26

SEMICONDUCTOR MEMORY DEVICE WHICH INCLUDES MEMORY CELL HAVING CHARGE ACCUMULATION LAYER AND CONTROL GATE

BACKGROUND OF THE INVENTION

1. Field of the Invention

The present invention relates to a semiconductor memory device. For example, the present invention relates to a semiconductor memory device comprising memory cells each having a charge accumulation layer and a control gate.

2. Description of the Related Art

Electrically erasable and programmable ROMs (EEPROMs) are known as nonvolatile semiconductor memories that allow data to be electrically rewritten. NAND flash memories are known as EEPROMs for which the capacity and integration degree can be increased.

An increasing number of voltage types have been required for the recent NAND flash memories which have reduced sizes and use multi-level data. For example, when data is written, plural types of voltages need to be applied to unselected word lines. A configuration using a plurality of voltages is described in, for example, U.S. Pat. No. 7,088,620.

However, an increase in the number of voltage types or in the number of variations in a load on a charge pump circuit that generates voltages increases the number of charge pump circuits and the number of charge pump circuit types. This also makes it difficult to control the charge pump circuit.

BRIEF SUMMARY OF THE INVENTION

A semiconductor memory device according to an aspect of the present invention includes:

a memory cell unit in which a plurality of memory cells are connected in series, each of the memory cells including a charge accumulation layer and a control gate formed above the charge accumulation layer;

word lines each connected to the control gate of each of the corresponding memory cells;

a driver circuit which selects one of the word lines and applies voltages to a selected word line and unselected word lines during a data write operation and a data read operation; and a voltage generator which includes a first charge pump circuit and a second charge pump circuit and which outputs a voltage generated by the first and second charge pump circuits to the driver circuit, the first charge pump circuit being exclusively used to generate a voltage for a first word line, the first word line being one of the unselected word lines located adjacent to the selected word line, the second charge pump circuit generating a voltage for second word lines, the second word lines being the unselected word lines which are not located adjacent to the selected word line.

BRIEF DESCRIPTION OF THE SEVERAL VIEWS OF THE DRAWING

FIG. 1 is a block diagram of a flash memory in accordance with a first embodiment of the present invention;

FIG. 2 is a diagram showing voltages generated by a voltage generator in accordance with the first embodiment of the present invention;

FIG. 8 is a diagram showing voltages applied to word lines and select gate lines in the flash memory in accordance with the first embodiment of the present invention during the write operation;

FIG. 9 is a diagram showing voltages applied to the word lines and select gate lines in the flash memory in accordance with the first embodiment of the present invention during the read operation;

FIG. 10 is a timing chart showing voltages applied to the word lines in the flash memory in accordance with the first embodiment of the present invention during the read operation;

FIG. 17 is a diagram showing voltages applied to the word lines and select gate lines in a flash memory in accordance with a first variation of the first to third embodiments of the present invention during the write operation;

FIG. 18 is a diagram showing voltages applied to the word lines and select gate lines in the flash memory in accordance with the first variation of the first to third embodiments of the present invention during the read operation;

FIG. 19 is a diagram showing voltages applied to the word lines and select gate lines in the flash memory in accordance with a second variation of the first to third embodiments of the present invention during the write operation;

FIG. 20 is a diagram showing voltages applied to the word lines and select gate lines in the flash memory in accordance with the second variation of the first to third embodiments of the present invention during the read operation;

FIG. 21 is a diagram showing voltages applied to the word lines and select gate lines in the flash memory in accordance with a third variation of the first to third embodiments of the present invention during the write operation;

FIG. 22 is a graph showing the distribution of the threshold of a memory cell transistor in accordance with a fourth variation of the first to third embodiments of the present invention;

FIG. 25 is a schematic diagram of a memory cell array in accordance with a fifth variation of the first to third embodiments of the present invention; and FIG. 26 is a circuit diagram of a sense amplifier provided in a flash memory in accordance with a sixth variation of the first to third embodiments of the present invention.

DETAILED DESCRIPTION OF THE INVENTION

1st Embodiment

Figure 3:
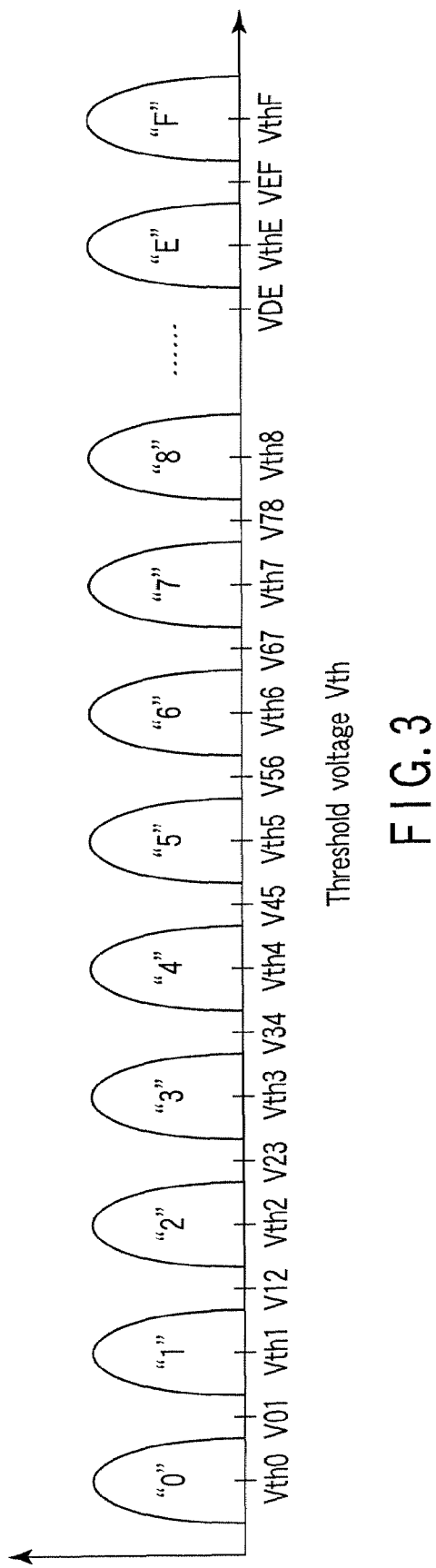
FIG. 3 is a graph showing the distribution of the threshold of a memory cell transistor in accordance with the first embodiment of the present invention.

Description will be given of a semiconductor memory device in accordance with a first embodiment of the present invention. FIG. 1 is a block diagram of the NAND flash memory in accordance with the present embodiment.

As shown in the figure, the NAND flash memory 1 includes a memory cell array 10, a sense amplifier 20, a source line driver 30, a row decoder 40, a driver circuit 50, a voltage generator 60, and a control circuit 70.

First, the memory cell array 10 will be described. The memory cell array 10 includes a plurality of memory cell units 11. Each of the memory cell units 11 includes, for example, 32 memory cell transistors MT and select transistors ST1 and ST2. Each of the memory cell transistors MT includes a stack gate structure having a charge accumulation layer (for example, a floating gate) formed on a semiconductor substrate with a gate insulating film interposed therebetween and a control gate electrode formed on the charge accumulation layer with an intergate insulating film interposed therebetween. The number of memory cell transistors MT is not limited to 32 but may be 8, 16, 64, 128, 256, or the like. No limitation is imposed on the number of memory cell transistors MT. The adjacent memory cell transistors share a source and a drain. A current path for the memory cell transistors MT is located between the select transistors ST1 and ST2 so as to connect the memory cell transistors MT together in series. A drain at one end of the group of the series connected memory cell transistors MT is connected to a source of the select transistor ST1. A source at the other end of the group is connected to a drain of the select transistor ST2.

A control gate electrode for the memory cell transistors MT in the same row is commonly connected to a corresponding one of word lines WL0 to WL31. Gates of the memory cell select transistors ST1 in the same row are commonly connected to select gate lines SGD. Gates of the memory cell select transistors ST2 in the same row are commonly connected to a select gate lines SGS. For simplification, the word lines WL0 to WL31 may be simply referred to as a word line WL below. A drain of the select transistor ST1 in the same column in the memory cell array 10 is commonly connected to a corresponding one of bit lines BL to BLm (m is a natural number). The bit lines BL0 to BLm may also be simply referred to as a bit line BL. A source of each of the select transistors ST2 is connected to a source line SL. Not both the select transistors ST1 and ST2 are required. Only one of the select transistors may be provided if the select transistor enables any of the memory cell units 11 to be selected.

FIG. 2 shows only the memory cell units 11 in one row. However, plural rows of memory units 11 may be provided in the memory cell array 10. In this case, the memory cell units 11 in the same column are connected to the same bit line BL. Data is written to a plurality of the memory cell transistors MT connected to the same word line WL at a time. This unit is called a page. Data is erased from a plurality of the memory cell units 11 in the same row at a time. This unit is called a memory block.

A sense amplifier 20 senses and amplifies data read from any of the memory cell transistors MT to the corresponding bit line BL.

A source line driver 30 provides a voltage to any of the source lines.

A row decoder 40 includes MOS transistors 41 and 42 provided for select gate lines SGD and SGS, respectively, a MOS transistor 43 provided for each of the word lines WL0 to WL31, and a block decoder 44.

One end of a current path through each of the MOS transistors 41 and 42 is connected to the select gate line SGD or SGS, respectively. The other end is connected to a signal line SGDD or SGSD. One end of a current path through the MOS transistor 43 is connected to a corresponding one of the word lines WL0 to WL31. The other end is connected to a corresponding one of signal lines CG0 to CG31. In the description below, if the signal lines CG0 to CG31 are not distinguished from one another, the signal lines are simply referred to as a signal line CG. The same control line TG connects to gates of the MOS transistors 41 to 43 connected to the select gate lines SGD and SGS and word lines WL connected to the select transistors ST1 and ST2 and memory cell transistor MT in the same memory block.

The block decoder 44 receives and decodes an external block address. The block decoder 44 then selects the control line TG connecting to the MOS transistors 43 corresponding to the memory cell unit 11 including a selected memory cell transistor to turn on the MOS transistors 41 to 43.

A driver circuit 50 includes select gate drivers 51 and 52 provided for signal lines SGDD and SGSD, respectively, word line drivers 53 provided for respective signal lines CG, and a page decoder 50.

The page decoder 54 receives and decodes a page address. The decode result is provided to each of the drivers 51 to 53. The select gate line drivers 51 and 52 apply voltages to the signal lines SGDD and SGSD in accordance with the decode result from the page decoder 54. The word line driver 53 applies voltages to the signal lines CG0 to CG31 in accordance with the decode result from the page decoder 54. The configuration of the drivers 51 to 53 and voltages applied by the drivers 51 to 53 will be described below in detail.

A control circuit 70 receives an external command to control the operation of the voltage generator 60 in accordance with the command. That is, the control circuit 70 instructs the voltage generator 60 to generate appropriate voltages during a data write operation, a data read operation, a data erase operation, and the like.

The voltage generator 60 includes a first charge pump circuit 61, four second charge pump circuit 62-1 to 62-4, and a third charge pump circuit 63. If the second charge pump circuits 62-1 to 62-4 are not distinguished from one another, the second charge pump circuits 62-1 to 62-4 are collectively called a second charge pump circuit 62.

To write data to and read data from the memory cell transistor MT, the first charge pump circuit 61 generates a voltage to be applied to unselected word lines WL located adjacent to a selected word line WL.

To write data to and read data from the memory cell transistor MT, the second charge pump circuit 62 generates a voltage to be applied to the unselected word lines other than those to which voltages are provided by the first charge pump circuit 61.

The third charge pump circuit 63 generates voltages required to control the drivers 51 to 53.

The voltage generator 60 contains a charge pump circuit (fourth charge pump circuit) that generates a write voltage VPGM to be applied to a selected word line during a write operation and a charge pump circuit (fifth charge pump circuit) that generates a read voltage VCGR to be applied to a selected word line during the read operation. However, these charge pump circuits are omitted in the present specification.

With reference to FIG. 2, description will be given of voltages generated by the first to third charge pump circuits 61 to 63 and the fourth charge pump circuit described above.

FIG. 2 is a table showing voltages generated by the first to third charge pump circuits 61 to 63 and the fourth charge pump circuit.

As shown in the figure, the first charge pump circuit 61 generates a voltage VPASSH during the data write operation and a voltage VREADLA during the data read operation. The second charge pump circuit 62 generates a voltage VPASS (<VPASSH) or voltages VPASS and VPASSL (<VPASS) during the data write operation and a voltage VREAD during the read operation. The third charge pump circuit 63 generates a voltage VREADH during the write and read operations. The fourth charge pump circuit generates a voltage VPGM during the write operation and a voltage VCGR during the read operation as described above. The usage of these voltages will be described below.

Now, the distribution of the threshold of the memory cell transistor MT will be described with reference to FIG. 3. In FIG. 3, the abscissa indicates a threshold voltage Vth and the ordinate indicates the presence probability of the memory cell transistors.

As shown in the figure, each of the memory cell transistors MT can hold 16-level data (4-bit data). That is, the memory cell transistor MT can hold 16 values, "0", "1", "2", "3", . . . , "9", "A", "B", . . . , "F" in order of increasing threshold voltage Vth. For a threshold voltage Vth0 for "0" data in the memory cell transistor MT, Vth0<V01. For a threshold voltage Vth1 for "1" data in the memory cell transistor MT, V01<Vth1<V12. For a threshold voltage Vth2 for "2" data in the memory cell transistor MT, V12<Vth2<V23. For a threshold voltage Vth3 for "3" data in the memory cell transistor MT, V23<Vth3<V34. For a threshold voltage Vth4 for "4" data in the memory cell transistor MT, V34<Vth4<V45. For a threshold voltage Vth5 for "5" data in the memory cell transistor MT, V45<Vth5<V56. For a threshold voltage Vth6 for "6" data in the memory cell transistor MT, V56<Vth6<V67. For a threshold voltage Vth7 for "7" data in the memory cell transistor MT, V67<Vth7<V78. For a threshold voltage Vth8 for "8" data in the memory cell transistor MT, V78<Vth8<V89. For a threshold voltage Vth9 for "9" data in the memory cell transistor MT, V89<Vth9<V9A. For a threshold voltage VthA for "A" data in the memory cell transistor MT, V9A<VthA<VAB. For a threshold voltage VthB for "B" data in the memory cell transistor MT, VAB<VthB<VBC. For a threshold voltage VthC for "C" data in the memory cell transistor MT, VBC<VthC<VCD. For a threshold voltage VthD for "D" data in the memory cell transistor MT, VCD<VthD<VDE. For a threshold voltage VthE for "E" data in the memory cell transistor MT, VDE<VthE<VEF. For a threshold voltage VthF for "F" data in the memory cell transistor MT, VEF<VthF.

The data that can be held by the memory cell transistor MT is not limited to the 16-level data but may be, for example, 2-level (1-bit) data, 4-level (2-bit) data, or 8-level (3-bit) data.

Figure 4:
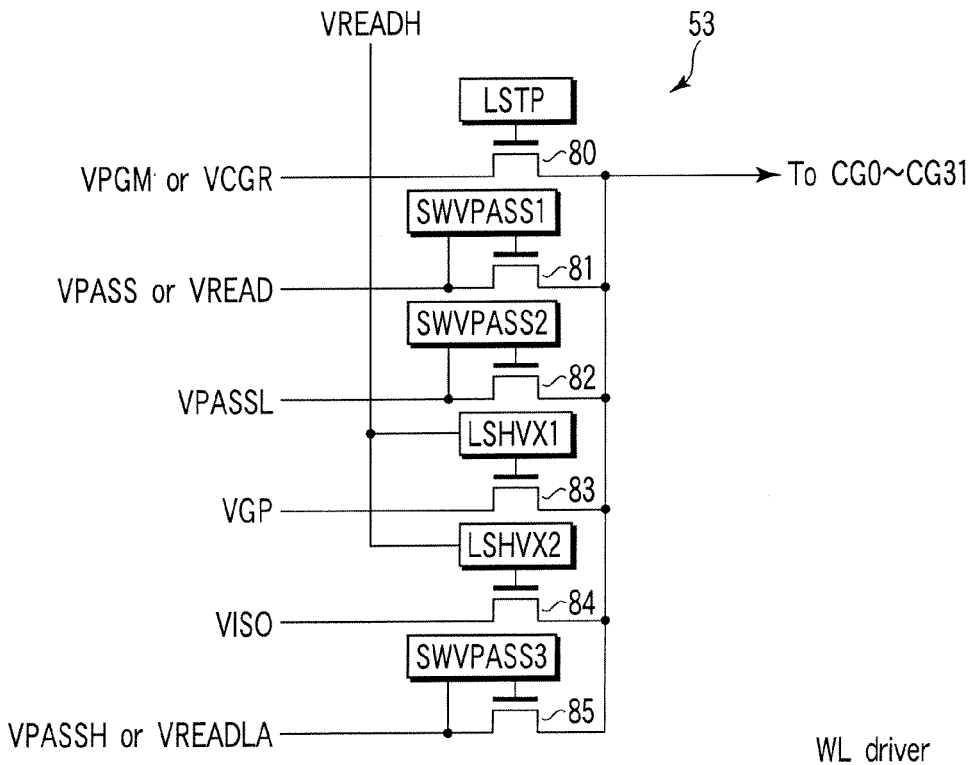
FIG. 4 is a circuit diagram of a word line driver in accordance with the first embodiment of the present invention.

Now, the configuration of the word line driver 53, described in FIG. 1, will be described with reference to FIG. 4. As shown in the figure, the word line driver 53 includes n-channel MOS transistors 80 to 85.

An output signal from a level shifter circuit LSTP is input to a gate of the MOS transistor 80. A voltage VPGM or VCGR is applied to one end of the current path of the MOS transistor 80. The other end of the current path is connected to a corresponding one of the signal lines CG0 to CG31.

An output signal from a local pump circuit SWVPASS1 is input to a gate of the MOS transistor 81. A voltage VPASS or VREAD is applied to one end of the current path of the MOS transistor 81. The other end of the current path is connected to a corresponding one of the signal lines CG0 to CG31.

An output signal from a local pump circuit SWVPASS2 is input to a gate of the MOS transistor 82. A voltage VPASSL is applied to one end of the current path pf the MOS transistor 82. The other end of the current path is connected to a corresponding one of the signal lines CG0 to CG31.

An output signal from a local pump circuit LSHVX1 is input to a gate of the MOS transistor 83. A voltage VGP is applied to one end of the current path of the MOS transistor 83. The other end of the current path is connected to a corresponding one of the signal lines CG0 to CG31.

An output signal from a level shifter circuit LSHVX2 is input to a gate of the MOS transistor 84. A voltage VISO is applied to one end of the current path of the MOS transistor 84. The other end of the current path is connected to a corresponding one of the signal lines CG0 to CG31.

An output signal from a local pump circuit SWVPASS3 is input to a gate of the MOS transistor 85. A voltage VPASSH or VREADLA is applied to one end of the current path of the MOS transistor 85. The other end of the current path is connected to a corresponding one of the signal lines CG0 to CG31.

A page decoder 54 selects any of the level shifter circuit LSTP, local pump circuits SWVPASS1 to SWVPASS3, and level shifter circuits LSHVX1 and LSHVX2. The level shifter circuits LSHVX1 and LSHVX2 carry out a level conversion of their output level to the voltage VREADH level. Voltages VGP and VISO may be provided by the voltage generator 60 or other voltages may be used as voltages VGP and VISO. The functions of these voltages will be described below. The word line driver 53 configured as described turns on one of the MOS transistors 80 to 85 in accordance with the decode result from the page decoder 54.

That is, for the word line driver 53 corresponding to the selected word line, the MOS transistor 80 is turned on. During the write operation, voltage VPGM is transferred to the corresponding signal line CG. During the read operation, voltage VCGR is transferred to the corresponding signal line CG.

For the word line drivers 53 corresponding to the unselected word lines, during the write operation, one of the transistors 81 to 85 is turned on to transfer one of voltages VPASS, VPASSL, VGP, VISO, and VPASSH to the corresponding signal line CG. For the read operation, one of the MOS transistors 81 and 85 is turned on to transfer one of voltages VREAD and VREADLA to the corresponding signal line CG.

Figure 5:
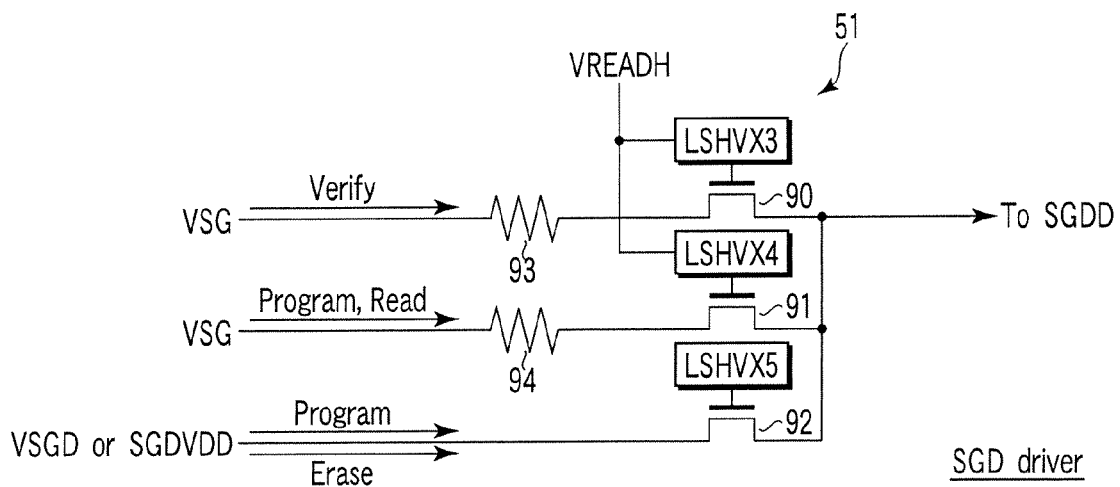
FIGS. 5 and 6 are circuit diagrams of a select gate line driver in accordance with the first embodiment of the present invention.

Now, the configuration of the select gate line driver 51 will be described with reference to FIG. 5. FIG. 5 is a circuit diagram of the select gate line driver 51. As shown in the figure, the select gate driver 51 includes n-channel MOS transistors 90 to 92 and resistance elements 93 and 94.

An output signal from a level shifter circuit LSHVX3 is input to a gate of the MOS transistor 90. A voltage VSG is applied to the current path of the MOS transistor 90 via the resistance element 93. The other end of the current path is connected to the corresponding signal line SGDD.

An output signal from a level shifter circuit LSHVX4 is input to a gate of the MOS transistor 91. A voltage VSG is applied to the current path of the MOS transistor 91 via the resistance element 94. The other end of the current path is connected to the corresponding signal line SGDD.

An output signal from a level shifter circuit LSHVX5 is input to a gate of the MOS transistor 92. A voltage VSGD or SGDVDD is applied to the current path of the MOS transistor 92. The other end of the current path is connected to the corresponding signal line SGDD.

One of the level shifter circuits LSHVX3 to LSHVX5 is selected by the page decoder 54. The level shifter circuits LSHVX3 and LSHVX4 convert an output signal into a voltage VREADH level. Voltages VSG, VSGD, and SGDVDD are provided by, for example, the voltage generator 60. The select gate line driver 51 configured as described above turns on one of the MOS transistors 90 to 92 in accordance with the decode result from the page decoder 54.

That is, for the read operation, one of the MOS transistors 91 and 92 is turned on to transfer one of voltages VSG and VSGD to the signal line SGSD. For the read operation, the MOS transistor 92 is turned on to transfer voltage VSG to the signal line SGDD. For the erase operation, the MOS transistor 92 is turned on to transfer voltage SGDVDD to the signal line SGDD. For a data verification operation, the MOS transistor 90 is turned on to transfer voltage VSG to the signal line SGDD.

Now, the configuration of the select gate driver 52 will be described with reference to FIG. 6. As shown in the figure, the select gate driver 52 includes n-channel MOS transistors 100 to 102 and a resistance element 103.

An output signal from a level shifter circuit LSHVX6 is input to a gate of the MOS transistor 100. Voltage VSG is applied to one end of the current path of the MOS transistor 100. The other end of the current path is connected to the corresponding signal line SGSD.

An output signal from a level shift circuit LSHVX7 is input to a gate of the MOS transistor 101. Voltage VSG is applied to one end of the current path of the MOS transistor 101. The other end of the current path is connected to the corresponding signal line SGSD.

An output signal from a level shifter circuit LSHVX8 is input to a gate of the MOS transistor 102. 0V is applied to one end of the current path of the MOS transistor 102. The other end of the current path is connected to the corresponding signal line SGSD.

One of the level shifter circuits LSHVX6 to LSHVX8 is selected by the page decoder 54. The level shifter circuits LSHVX6 and LSHVX7 convert an output signal into a voltage VREADH level. Voltage VSG is provided by, for example, the voltage generator 60. The select gate line driver 52 configured as described above turns on one of the MOS transistors 100 to 102 in accordance with the decode result from the page decoder 54.

That is, for the read operation, the MOS transistor 101 is turned on to transfer voltage VSG to the signal line SGSD. For the erase operation, the MOS transistor 102 is turned on to transfer 0V to the signal line SGSD. For the data write operation and the data verification operation, the MOS transistor 100 is turned on to transfer voltage VSG to the signal line SGSD.

Figures 6, 7:
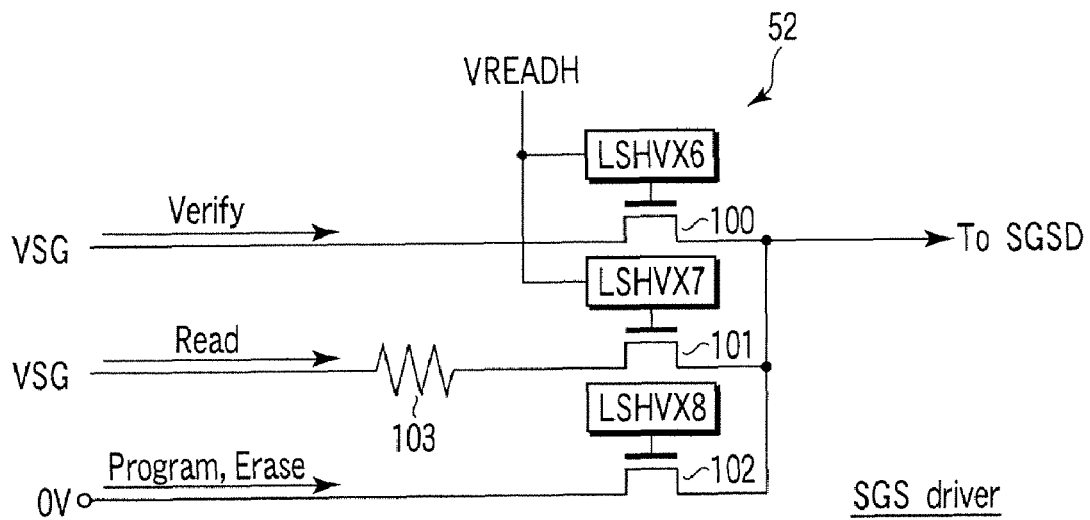
FIG. 7 is a diagram showing voltages applied to word lines in the flash memory in accordance with the first embodiment of the present invention during write and read operations.

With reference to FIG. 7, description will be given of the voltages applied to the word lines WL by the word line driver 53. FIG. 7 is a table showing the voltages applied to the selected word line WL and the unselected word lines WL during the data write operation and the data read operation.

As shown in the figure, the voltage applied to a selected word line WLi ($0 \geq i \geq 31$) is VPGM for the write operation and VCGR for the read operation. That is, in the word line driver 53 corresponding to the word line WLi, the MOS transistor 80 is turned on.

The voltage applied to an unselected word line WL(i+1) located adjacent to the selected word line WLi and closer to the select gate line SGD is VPASSH for the write operation and VREADLA for the read operation. That is, in the word line driver 53 corresponding to the word line WL(i+1), the MOS transistor 85 is turned on.

The voltage applied to the other unselected word lines WL is one of VPASS, VPASSL, VGP, and VISO for the write operation. That is, in the word line driver 53, one of the MOS transistors 81 to 84 is turned on. The voltage applied during the read operation is VREAD. That is, in the word line driver 53, the MOS transistor 81 is turned on.

Now, a detailed description will be given of the data write operation and data read operation of the NAND flash memory, focusing particularly on the voltages applied to the word lines WL.

<Write Operation>

The write operation will be described. In the description below, the case in which charges are injected into the charge accumulation layer to raise the threshold voltage of the memory cell transistor MT is called a "0"-program. On the other hand, the case in which the injection of charges into the accumulation layer is prevented and thus the threshold voltage is not changed (in other words, the amount of injected charges is reduced enough to avoid shifting held data to another level) is called a "1"-program. FIG. 8 is a table showing the voltage applied to the select gate lines SGS and SGD and word lines WL0 to WL31.

As shown in the figure, voltage VSGD is applied to the select gate line SGD, and 0V is applied to the select gate line SGS. As described above, voltage VPGM is applied to the selected WLi. Voltage VPASSH is applied to the unselected word line WL(i+1). Voltage VPASS is applied to the other unselected word lines WLC to WL(i−1) and WL(i+2) to WL31.

Voltage VPGM is high enough to inject charges into the charge accumulation layer, for example, 20V. Voltages VPASSH and VPASS enable the memory cell transistor MT to be turned on regardless of the held data. The relationship between voltages VPGM, VPASSH and VPASS is VPGM>VPASSH>VPASS. Voltage VSGD allows the select transistor ST1 to transfer the "0"-program data, while the voltage VSGD inhibits transfer of the "1"-program data by the select transistor ST1. In other words, voltage VSGD turns on the select transistor ST1 for the "0"-program, while cutting off the select transistor ST1 for the "1"-program.

As a result, memory cell transistors MT0 to MT31 are turned on to form a channel. That is, a current path is formed through memory cell transistors MT0 to MT31 in the memory cell unit 11 and becomes conductive. Furthermore, since 0V is applied to the select gate line SGS, the select transistor ST2 is cut off. In contrast, the select transistor ST1 is turned on or cut off depending on the program data.

If the "0"-program is executed, a write voltage (for example, 0V) is applied to the bit line. Consequently, the select transistor ST1 is turned on to transfer 0V provided to the bit line to the channel of the memory cell transistors MT0 to MT31. Then, in a memory cell transistor MTi connected to the selected word line WLi, the difference in potential between the gate and channel becomes almost equal to VPGM. Thus, charges are injected into the charge accumulation layer. This raises the threshold voltage of memory cell transistor MTi to allow the "0"-program to be executed.

On the other hand, if the "1"-program is executed, a write inhibit voltage Vinhibit (>write voltage) is applied to the bit line to cut off the select transistor ST1. Consequently, the channel of the memory cell transistors MT0 to MT31 in the memory cell unit 11 is brought into an electrically floating state. The channel potential of memory cell transistors MT0 to MT31 is then raised by coupling to the gate potential (VPGM, VPASSH, and VPASS) of memory cell transistors MT0 to MT31. Thus, in memory cell transistor MTi connected to the selected word line WLi, the potential difference between the gate and channel is insufficient, preventing the injection of charges into the charge accumulation layer (the amount of charges injected into the charge accumulation layer is insufficient to shift the level of the held data). As a result, the threshold voltage of memory cell transistor MTi remains unchanged to allow the "1"-program to be executed. Similarly, in the memory cell transistors MT0 to MT(i−1) and MT(i+1) to MT31 connected to the unselected word lines WL0 to WL(i−1) and WL(i+1) to WL31, the potential difference between the gate and channel is small, preventing the injection of charges into the charge accumulation layer.

<Read Operation>

Now, the data read operation will be described. FIG. 9 is a table showing the voltages applied to the select gate lines SGS and SGD and the word lines WL0 to WL31 during the data read operation.

As shown in the figure, voltage VSG is applied to the select gate lines SGD and SGS. As described above, voltage VCGR is applied to the selected word line WLi. Voltage VREADLA is applied to the unselected word line WL(i+1). Voltage VREAD is applied to the word lines WL0 to WL(i−1) and WL(i+2) to WL31.

Voltage VREAD turns on the memory cell transistor MT regardless of the held data. Voltage VCGR is applied to a memory cell transistor from which data is to be read and varies depending on the data to be read. For example, to read the "0" data, voltage VCGR is set at V01. To read the "1" data, voltage VCGR is set at V12. Voltage VREADLA varies depending on the data in memory cell transistor MT(i+1) and turns on memory cell transistor MT(i+1). Voltage VSG turns on the select transistors ST1 and ST2.

As a result, the select transistors ST1 and ST2 and the unselected memory cell transistors MT0 to MT(i−1) and MT(i+1) to MT31 are turned on. Memory cell transistor MTi is then turned on provided that transistor MTi holds data corresponding to a threshold voltage lower than voltage VCGR. On the other hand, memory cell transistor MTi is turned off provided that the transistor MTi holds data corresponding to a threshold voltage equal to or higher than voltage VCGR. The bit line maintains a precharge voltage. The potential variation occurring in the bit line is sensed and amplified by the sense amplifier 20 to allow the data to be read.

The read operation will be described in detail with reference to FIG. 10. FIG. 10 is a timing chart for the potentials of the selected word line WLi and the unselected word line WL(i+1) during the data read operation.

As shown in the figure, the data read operation includes a first read step executed during time t1 to time t2 and a second read step executed during time t3 to time t4.

During the first read step, data is read from the unselected memory cell transistor (i+1) connected to the unselected word line WL(i+1) positioned closer to the drain than the selected word WLi. This is executed to determine the effect (hereinafter referred to as a coupling effect) of the coupling between floating gates which are exerted on the selected memory cell transistor MTi. That is, the memory cell transistor MT may have its threshold voltage apparently increased by the effect of the adjacent memory cell transistor MT. The effect varies depending on the data held by the adjacent memory cell transistor MT. Thus, during the first read step, the read operation is performed on the unselected memory cell transistor MT(i+1) to pre-check the data held by memory cell transistor MT(i+1). Thus, during the first read step, voltage VREAD is applied to the selected word line WLi. Voltage VCGR is applied to the unselected word line WL(i+1). Voltage VCGR varies among 16 levels depending on the 16-level data. At each level, any of the "0" to "F" data is read.

During the second step, data is read from the selected memory cell transistor MTi connected to the selected word line WLi. That is, voltage VCGR is applied to the selected word line WLi. Voltage VREADLA is applied to the unselected word line WL(i+1). Voltage VREADLA is generated by the first charge pump circuit 61 as described above and has a magnitude corresponding to the data read from memory cell transistor MT(i+1) during the first read step. The voltages shown in FIG. 9 are provided during the second read step.

Now, description will be given of the operation of the voltage generator 60 during the write and read operations.

Figure 11:
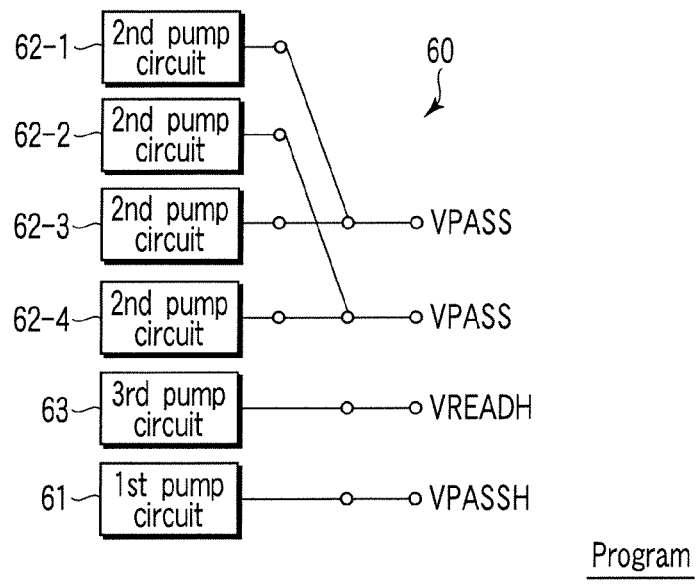
FIGS. 11 and 12 are block diagrams of the voltage generator in accordance with the first embodiment of the present invention.

First, the write operation will be described with reference to FIG. 11. FIG. 11 is a block diagram of the voltage generator 60. As shown in the figure, the first charge pump circuit 61 generates voltage VPASSH to be applied to the word line WL(i+1). The third charge pump circuit 63 generates voltage VREADH. The second charge pump circuits 62-1 and 62-3 have respective output nodes connected together to generate voltage VPASS. The second charge pump circuits 62-2 and 62-4 have respective output nodes connected together to generate voltage VPASS.

Figure 12:
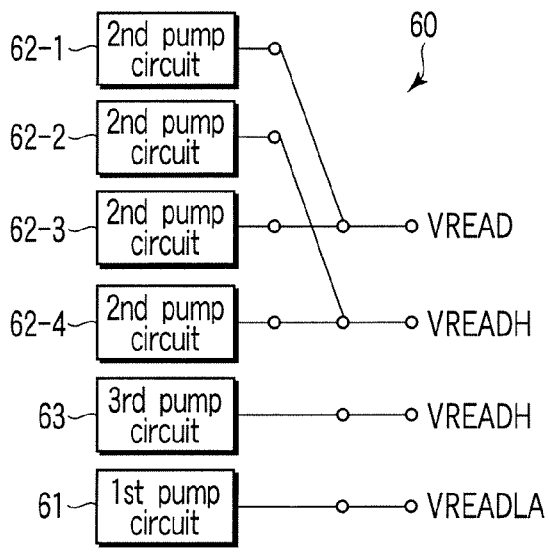

Now, the read operation will be described with reference to FIG. 12. FIG. 12 is a block diagram of the voltage generator 60. As shown in the figure, the first charge pump circuit 61 generates voltage VREADLA to be applied to the word line WL(i+1). The third charge pump circuit 63 generates voltage VREADH. The second charge pump circuits 62-1 and 62-3 have respective output nodes connected together to generate voltage VREAD. The second charge pump circuits 62-2 and 62-4 have respective output nodes connected together to generate voltage VREADH.

As described above, the semiconductor memory device in accordance with the first embodiment of the present invention produces the following effect.

(1) The voltage can be accurately controlled while inhibiting an increase in the circuit scale of the semiconductor memory device.

In conventional NAND flash memories, various voltages are applied to the word line WL in order to optimize write and read properties. Thus, the word line driver can switch among the various voltages so as to apply the optimum voltage to the word line WL.

The use of the various voltages has complicated a voltage generating system for supplying voltages to the unselected word lines. This is due to the need for the voltage generating system to take a variation in load into account.

On the other hand, it has been important to correct the coupling effect between the charge accumulation layers. In this case, an important technique is to control the voltage of the unselected word line WL(i+1) located adjacent to the selected word line WLi independently of the other unselected word lines.

That is, in the NAND flash memory, data is not always sequentially written starting with the source-side memory cell transistor MT. For example, memory cell transistor MTn connected to the word line WLn may be written after memory cell transistor MT(n+1) connected to the word line WL(n+1) has been written, (this technique will be described below).

If such a write technique is used, then to improve the boot properties during the write operation, the voltage of the unselected word line WL(i+1) is desirably set at VPASSH, which is higher than VPASS applied to the unselected word line other than WL(i+1). During the data read operation, the voltage of the word line WL(i+1) needs to be accurately controlled in accordance with the read level.

In this regard, the conventional voltage generating system is not configured to take into account the voltage to be applied only to the unselected word line WL(i+1). Consequently, one of the charge pump circuits generating voltage VPASSH or VREAD is used for the voltage to be applied to the unselected word line WL(i+1). That is, one of the second charge pump circuits 62 in the voltage generator 60, described for FIG. 1 is used.

However, these charge pump circuits generate a high voltage (VPASS or VREAD) to be applied to a large number of unselected word lines WL. The charge pump circuits thus have a high voltage generating ability and a very large circuit scale. Thus, if any of the charge pump circuits is used to generate the voltage to be applied to the unselected word line WL(i+1), another similar charge pump circuit may be required, resulting in an increase in the circuit scale of the NAND flash memory.

The charge pump circuits have a very high voltage generating capability. In contrast, the load to which voltages are to be applied is only WL(i+1) unselected word lines. That is, the relationship between the capability of the charge pump circuits and the load on the charge pump circuits is unbalanced. As a result, ripple, overshoot, or the like may occur in generated voltages, disadvantageously degrading voltage controllability.

However, in the configuration in accordance with the present embodiment, besides the conventional second and third charge pump circuits 62 and 63, the first charge pump circuit 61 is newly provided. The first charge pump circuit 61 is used to generate voltages VPASSH and VREADLA to be applied to the unselected word line WL(i+1).

Then, the first charge pump circuit 61 need not generate any other voltage (for example, VPASS or VREAD) and the load is only one word line. Thus, no high voltage generating capability is required. This enables a reduction in the size of the first charge pump circuit 61, allowing an increase in the circuit scale of the NAND flash memory to be minimized.

Furthermore, the first charge pump circuit 61 needs to generate only voltages VPASSH and VREADLA for one word line WL(i+1). The properties of the first charge pump circuit 61 can thus be correspondingly optimized. This reduces the unbalance between the first charge pump circuit 61 and the load, making it possible to minimize obstacles against fixed voltages. As a result, voltage controllability can be improved.

Moreover, even with the additional provision of the first charge pump circuit 61, the word line driver circuit 53 can be used for both the write and read operations. That is, in the configuration shown in FIG. 4, both voltages VPASSH and VREADLA are provided to the signal line CG via the current path of the MOS transistor 85. This also allows an increase in the circuit scale of the word line driver 53 to be minimized.

2nd Embodiment

Figure 13:
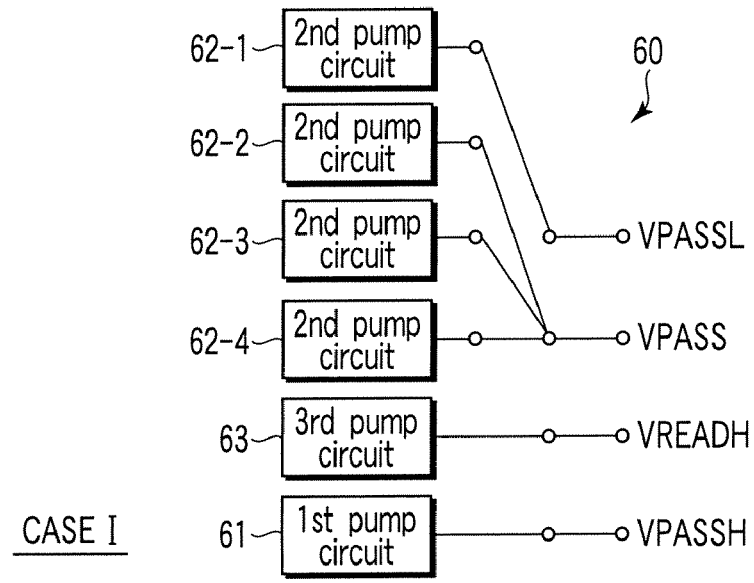
FIGS. 13 to 15 are block diagrams of a voltage generator in accordance with a second embodiment of the present invention.
Figure 14:
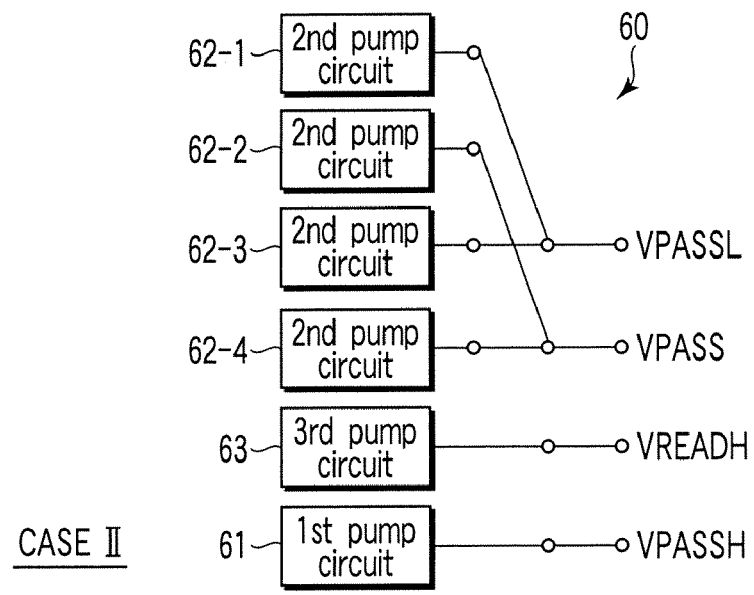
Figure 15:
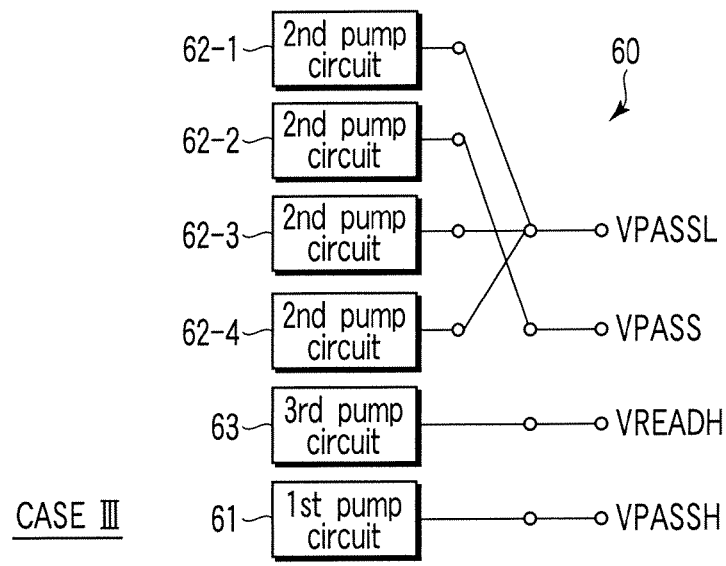

Now, description will be given of a semiconductor memory device in accordance with a second embodiment of the present invention. In the present embodiment, in addition to voltage VPASS, voltage VPASSL is used as the voltage to be applied to the unselected word lines during the write operation. The configuration and basic operation of the NAND flash memory in accordance with the present embodiment are the same as those in the first embodiment and will thus not be described below. Only differences from the first embodiment will be described below. FIGS. 13 to 15 are block diagrams of the voltage generator 60 during the write operation. Voltage VPASSL satisfies the relationship 0<VPASSL<VPASS. Of course, like voltage VPASS, voltage VPASSL allows the memory cell transistor MT to be turned on.

FIG. 13 shows that voltage VPASSL is applied to 1 to 10 of the 31 unselected word lines WL, with voltage VPASS applied to the remaining unselected word lines WL (that is, 20 to 29 unselected word lines). In this case, voltage VPASSL is generated by the second charge pump circuit 62-1. Voltage VPASS is generated by the three second charge pump circuits 62-2 to 62-4.

FIG. 14 shows that voltage VPASSL is applied to 11 to 20 of the 31 unselected word lines WL, with voltage VPASS applied to the remaining unselected word lines WL (that is, 10 to 19 unselected word lines) (CASE II). In this case, voltage VPASSL is generated by the two second charge pump circuits 62-1 and 62-3. Voltage VPASS is also generated by the two second charge pump circuits 62-2 and 62-4.

FIG. 15 shows that voltage VPASSL is applied to 21 to 29 of the 31 unselected word lines WL, with voltage VPASS applied to the remaining unselected word lines WL (that is, 1 to 9 unselected word lines) (CASE III). In this case, voltage VPASSL is generated by the three second charge pump circuits 62-1, 62-3, and 62-4. Voltage VPASS is also generated by the one second charge pump circuit 62-2.

As described above, the semiconductor memory device in accordance with the second embodiment of the present invention produces not only the effect (1) described in the first embodiment, but also the following effect.

(2) The operational reliability of the semiconductor memory device can be improved.

A configuration in accordance with the present embodiment uses not only voltage VPASS but also voltage VPASSL to allow the channel of the unselected memory cell transistors MT to be boosted.

The channel can be efficiently boosted by thus using the plural types of voltages for channel boosting. As a result, miswriting and the like can be effectively prevented, enabling the operational reliability of the NAND flash memory to be improved.

Moreover, the number of second charge pump circuits 62 generating each of voltages VPASS and VPASSL varies depending on the number of word lines to which the voltage is to be applied. That is, an increase in the number of word lines to which voltage VPASS is to be applied increases the number of second charge pump circuits 62 used to generate voltage VPASS, while reducing the number of second charge pump circuits 62 used to generate voltage VPASSL. In contrast, an increase in the number of word lines to which voltage VPASSL is to be applied increases the number of second charge pump circuits 62 used to generate voltage VPASSL, while reducing the number of second charge pump circuits 62 used to generate voltage VPASS.

Therefore, the voltage generating system and the load can be balanced, allowing the voltage controllability to be improved. This also contributes to improving the operational reliability of the NAND flash memory.

3rd Embodiment

Figure 16:
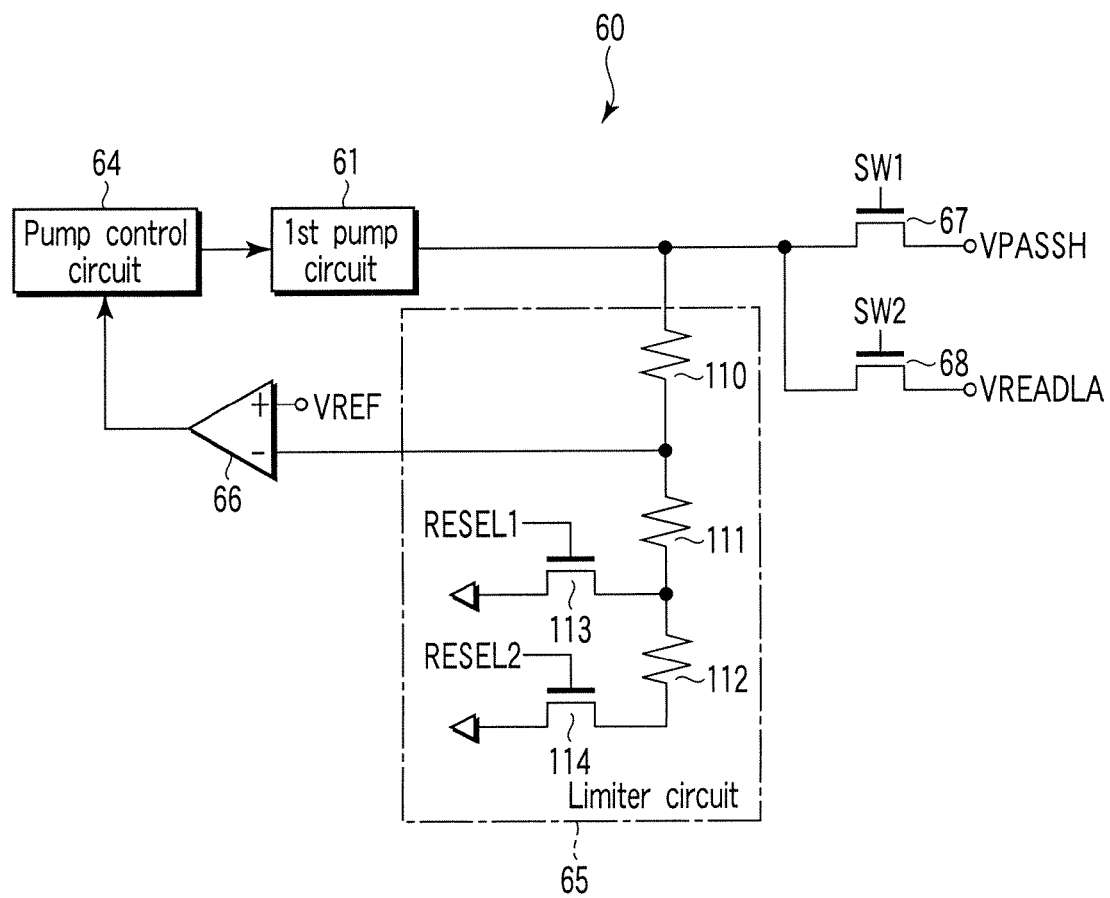
FIG. 16 is a block diagram showing a partial area of a voltage generator in accordance with a third embodiment of the present invention.

Now, description will be given of a semiconductor memory device in accordance with a third embodiment of the present invention. The present embodiment relates to the details of the voltage generator in the first embodiment or the second embodiment. The basic configuration and operation of the NAND flash memory in accordance with the present embodiment are the same as those in the first embodiment and will thus not be described below. Only differences from the first and second embodiments will be described below. FIG. 16 is a circuit diagram of the voltage generator 60 provided in the NAND flash memory in accordance with the present embodiment, particularly showing system generating voltages VPASSH and VREADLA.

As shown in FIG. 16, the voltage generator 60 includes not only the first charge circuit 61, described above, but also a pump control circuit 64, a limiter circuit 65, a comparator 66, and n-channel MOS transistors 67 and 68.

The first charge pump circuit 62 determines the magnitudes of voltages VPASSH and VREADLA to generate the voltages under the control of the pump control circuit 64.

A signal SW1 is input to a gate of the MOS transistor 67. One end of a current path of the MOS transistor 67 is connected to the output node of the first charge pump circuit 61. Voltage VPASSH is output from the other end of the current path. Signal SW1 is set to an "H" level for the write operation. That is, during the write operation, the MOS transistor 67 transfers voltage VPASSH output by the first charge pump circuit 61 to the word line driver 53.

A signal SW2 is input to a gate of the MOS transistor 68. One end of a current path of the MOS transistor 68 is connected to the output node of the first charge pump circuit 61. Voltage VREADLA is output from the other end of the current path. Signal SW2 is set to the "H" level for the data read operation. That is, during the read operation, the MOS transistor 68 transfers voltage VREADLA output by the first charge pump circuit 61 to the word line driver 53.

The limiter circuit 65 includes resistance elements 110 to 112 and n-channel MOS transistors 113 and 114. One end of the resistance element 110 is connected to the output node of the first charge pump circuit 61. The other end of the resistance element 110 is connected to one end of the resistance element 111. The other end of the resistance element 111 is connected to one end of the resistance element 112. A signal RESEL1 is input to a gate of the MOS transistor 113. One end of a current path of the MOS transistor 113 is connected to the connection node between the other end of the resistance element 111 and the one end of the resistance element 112. For the write operation, signal RESEL1 is set to the "H" level to turn on the MOS transistor 113. A signal RESEL2 is input to a gate of the MOS transistor 114. One end of a current path of the MOS transistor 114 is connected to the other end of the resistance element 112. For the read operation, signal RESEL2 is set to the "H" level to turn on the MOS transistor 114.

The comparator 66 compares a reference voltage VREF with the voltage of the connection node between the other end of the resistance element 110 and the one end of the resistance element 111. The comparator 66 then outputs a comparison result to the pump control circuit 64.

The pump control circuit 64 controls the operation of the first charge pump circuit 61 on the basis of the comparison result from the comparator 66.

In the above configuration, the upper limits of voltages VPASSH and VREADLA are determined by the limiter circuit 65. That is, the pump control circuit 64 allows the magnitude of voltage VPASSH during the write operation to be determined in accordance with the voltage division ratio of the resistance element 110 to the resistance element 111. The magnitude of voltage VREADLA during the read operation is also determined in accordance with the voltage division ratio of the resistance element 110 to the resistance elements 111 and 112.

As described above, the semiconductor memory device in accordance with the third embodiment of the present invention produces not only the effect (1) described in the first embodiment and the effect (2) described in the second embodiment, but also the following effect.

(3) An increase in the circuit scale of the semiconductor memory device can be inhibited.

In the configuration in accordance with the present embodiment, the limiter circuit 65 in each word line driver 53 can be used for both the write and read operations. That is, both the upper limits of voltages VPASSH and VREADLA are determined by the same limiter circuit 65. Consequently, even with the additional provision of the first charge pump circuit 61, an increase in the circuit scale of the word line driver 53 can be minimized.

Although not shown in FIG. 16, the second charge pump circuit 62 and the third charge pump circuit 63 each have a limiter circuit, a comparator, a pump control circuit, and the like, similarly to the first charge pump circuit 61.

As described above, the semiconductor memory device in accordance with the first to third embodiments of the present invention includes the memory cell unit 11, the word lines WL, the driver circuit 53, and the voltage generator 60. In the memory cell unit 11, the plurality of memory cell transistors MT are connected in series and each have the charge accumulation layer and the control gate formed above the charge accumulation layer. Each of the word lined WL is connected to the control gate of the corresponding memory cell transistor MT. The driver circuit 53 selects one of the word lines WL for the data write and read operations, and applies voltages to the selected word line WL and the unselected word lines WL. The voltage generator 60 includes the first charge pump circuit 61 and the second charge pump circuit 62, and outputs voltages generated by the first and second charge pump circuits 61 and 62 to the driver circuit 53. The first charge pump circuit 61 is exclusively used to generate voltages VPASSH and VREADLA, provided to the first word line WL(i+1) located adjacent to the selected word line WLi. The second charge pump circuit 62 generates voltages to those of the unselected word lines WL which are not located adjacent to the selected word line WLi, that is, the second word lines WL0 to WL(i−1) and WL(i+2) to WL31.

In the above configuration, the first charge pump circuit 61, exclusively used for the word line WL(i+1), is used for both the write and read operations. Thus, the row-intended driver circuit 53 as well as the limiter circuit in the first charge pump circuit 61 can be used for both the write and read operations. This makes it possible to provide an advanced control voltage supply system while minimizing a circuit area overhead. This in turn makes it possible to improve the write and read properties of the NAND flash memory ad thus the operational reliability of the NAND flash memory.

In the above description, the first charge pump circuit 61 generates only the voltage to be applied to the word line WL(i+1) located adjacent to the selected word line WLi on the drain side. However, the above embodiments are not limited to the word line WL(i+1) provided that the word line is the unselected word line WL located adjacent to the selected word line WLi. That is, as NAND flash memories are further miniaturized, it is expected to be more necessary to take into account the controllability of not only the word line WL(i+1) but also the word line WL(i−1). Also in this case, the above embodiments are applicable. Such an example will be described below.

FIGS. 17 and 18 are tables showing voltages applied to the select gate lines SGS and SGD and word lines WL0 to WL31 in a NAND flash memory in accordance with a first variation of the above embodiments. FIG. 17 shows the voltages during the write operation, and FIG. 18 shows the voltages during the read operation. As shown in FIGS. 17 and 18, voltages VPASSH and VREADLA may be applied to the word line WL(i−1) instead of the word line WL(i+1). In the present variation, voltages VPASS and VREAD are applied to the word line WL(i+1).

FIGS. 19 and 20 are tables showing voltages applied to the select gate lines SGS and SGD and word lines WL0 to WL31 in a NAND flash memory in accordance with a second variation of the above embodiments. FIG. 19 shows the voltages during the write operation, and FIG. 20 shows the voltages during the read operation. As shown in FIGS. 19 and 20, voltages VPASSH and VREADLA may be applied to both the word lines WL(i+1) and WL(i−1).

In the description of the above embodiments, voltage VPASS or VPASSH is applied to all the unselected word lines WL during the write operation. However, VPASS or VPASSH need not be applied to all the unselected word lines WL. Such a case will be described below.

During the data write operation, in the memory unit 11 including the memory cell transistor MT executing the "1"-program, the select transistors ST1 and ST2 are cut off. This causes the channel of the memory cell transistor MT included in the memory cell unit 11 to float electrically, raising the potential of the memory cell transistor MT owing to the coupling to the word line WL. This reduces the difference in potential between the gate and channel of memory cell transistor MTi connected to the selected word line WLi in the memory cell unit 11. The injection of charges into the charge accumulation layer is prevented to allow the "1"-program to be executed. Such a method of raising the channel potential on the basis of the coupling to the word line is known as a self-boost scheme.

How efficiently the channel potential can be boosted is important to the self-boost scheme. Insufficient boosting may erroneously cause the "0"-program to be executed on the memory cell transistors MT. In this regard, self-boosting using the programmed memory cell transistors MT may reduce boost efficiency depending on the data held by the transistors MT. Thus, for the memory cell transistors MT used for self-boosting, the rate of the memory cell transistors MT in an erase state is preferably increased. Such a case will be described below with reference to FIG. 21.

FIG. 21 is a table showing voltages applied to the select gate lines SGS and SGD and word lines WL0 to WL31 during the write operation of a NAND flash memory in accordance with a third variation of the above embodiments.

As shown in the figure, voltage VISO is applied to the unselected word line WL(i−5) closer to the source line than the selected word line WLi. Voltage VISO is, for example, 0V, and cuts off the memory cell transistor MT. Thus, memory cell transistors MT0 to MT(i−5), located closer to the source side than memory cell transistor MT(i−4) and already programmed, do not contribute to self-boosting. This makes it possible to improve the boost efficiency of the channel through memory cell transistors MTi to MT31.

The intermediate voltage VGP is applied to the word lines WL0 and WL31 and the word lines WL(i−4) and WL(i−6) located adjacent to the word line WL(i−5), to which voltage VISO is applied. Voltage VGP satisfies the relationship VISO and VSGD<VGP<VPASS. Application of voltage VGP makes it possible to prevent a possible significant potential difference between the adjacent word lines and between the word line and the select gate line.

In the description of FIG. 21, voltage VPASSH is applied only to the word line WL(i+1) by way of example. Voltage VPASSH may be applied to the word line WL(i−1) instead of the word line WL(i+1) or to both the word lines WL(i+1) and WL(i−1). Furthermore, the cut-off memory cell transistor MT is not limited to memory cell transistor MT(i−5), connected to the word line WL(i−5). Any memory cell transistor MT may be cut off provided that the memory cell transistor MT is positioned closer to the source side than memory cell transistor MTi.

<Example of a Method for Writing Data>

Description will be given of a method for writing data to the NAND flash memory in accordance with the first to third embodiments. For simplification, a 4-level NAND flash memory will be described below by way of example. However, the principle of the write method used for the 4-level NAND flash memory is also used for the 16-level NAND flash memory, described in the above embodiments and for other multi-bit NAND flash memories such as 8-level NAND flash memories.

FIG. 22 is a graph showing the distribution of the threshold of the memory cell transistor MT. As shown in the figure, each memory cell transistor MT can hold 4-level (2-bit) data. That is, the memory cell transistor MT can hold four binary data "11", "01", "10", and "00" in order of increasing threshold voltage Vth. In FIG. 22, the data is expressed in binary form.

For the threshold voltage Vth0 for the "11" data in the memory cell transistor MT, Vth0<V01. For the threshold voltage Vth1 for the "01" data, V01<Vth1<V12. For the threshold voltage Vth2 for the "10" data, V12<Vth2<V23. For the threshold voltage Vth3 for the "00" data, V23<Vth3<V34.

Figure 23:
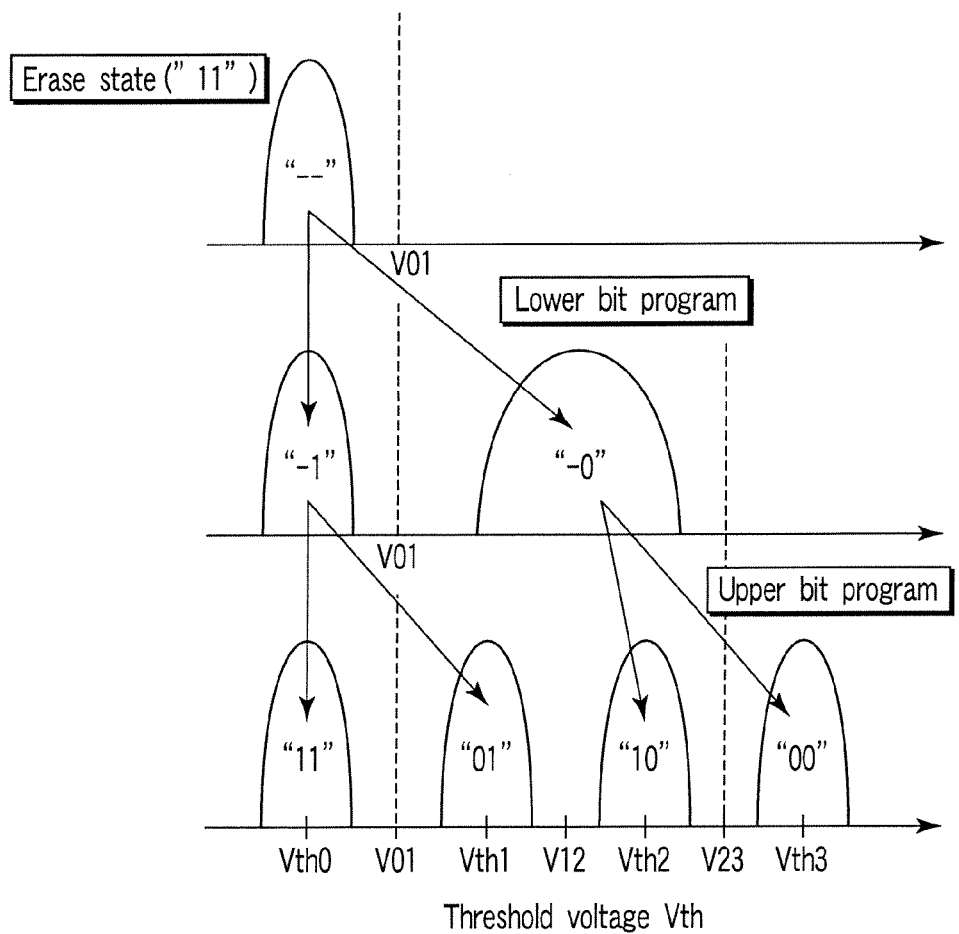
FIG. 23 is a graph showing the distribution of the threshold of the memory cell transistor in accordance with the fourth variation of the first to third embodiments of the present invention, the graph showing a variation in threshold distribution during the write operation.

The above data writing method will be described with reference to FIG. 23. FIG. 23 is a graph showing the distribution of the threshold of the memory cell transistor MT as well as a variation in the threshold distribution during the write operation.

As described above, data is written to each page at a time. The 2-bit data is written bit by bit. In this case, the lower-order bit of the 2 bits is first written, and the higher-order bit is then written. If the "0"-program is executed on the low-order bit, the write is roughly executed so that the threshold magnitude ranges from V01 to V23. While writing the higher-order bit, when "10" data is written, the data write operation is performed so that the threshold ranges from V12 to V23. When "00" data is written, the data write operation is performed so as to increase the threshold above V23.

Figure 24:
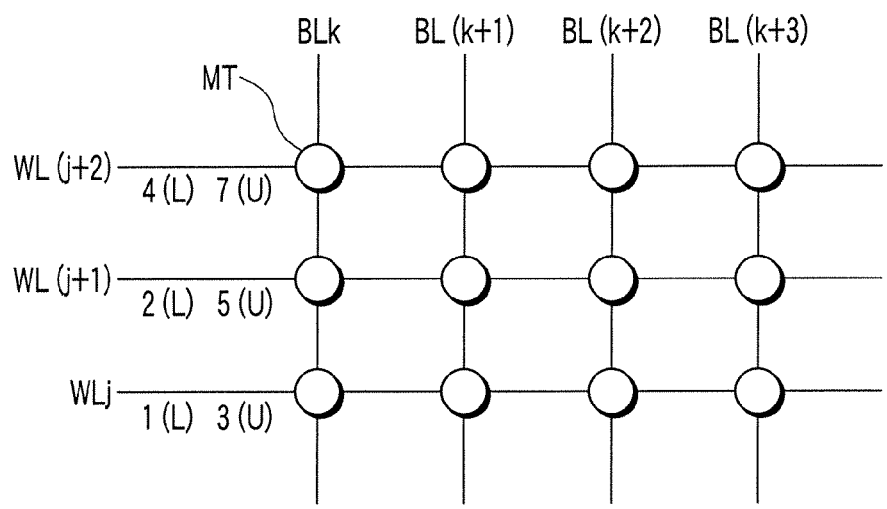
FIG. 24 is a schematic diagram of a memory cell array in accordance with the fourth variation of the first to third embodiments of the present invention.

The order in which data is written to each word line in the above write method will be described with reference to FIG. 24. FIG. 24 is a schematic diagram of the memory cell array 10. In the figure, the numbers shown adjacent to each word line indicates the order in which the write is executed. Reference character "L" denotes writing of the lower-order bit, and reference character "U" denotes writing of the higher-order bit. As shown in the figure, the lower-order bit is written first for the word line WLj and then for the word line WL(j+1). The higher-order bit for the word line WLj is subsequently written. The lower-order bit for the word line WL(j+1) is then written. The lower-order bit for the word line WL(j+2) is then written. The higher-order bit for the word line WL(j+1) is then written. That is, the data is not necessarily written in the order of the word lines. Specifically, before the higher-order bit is written for a certain word line, the writing of the lower-order bit needs to have been finished for the word lines located adjacent to that word line.

The present write method enables the coupling effect on memory cells MC to be reduced. The present method executes only rough writing of the lower-order bit. Consequently, almost no coupling effect is exerted on the memory cell transistors MT for which only the lower-order bit is written. Also for the writing of the higher-order bit, the present method can reduce the variation in the threshold of the memory cell transistor.

In the description of the present method, the higher- and lower-order bits are written to the memory cell transistors connected to a certain word line at a time. That is, data is written for the (m+1) memory cell transistors MT connected to one word line at a time. However, the data may be written, for example, in units of even-numbered bit lines and odd-numbered bit lines. This case will be described with reference to FIG. 25. FIG. 25 is a schematic diagram of the memory cell array. As shown in the figure, the order of the data writing is as follows: the low-order bit (even-numbered bit line) of the word line WLj, the low-order bit (odd-numbered bit line) of the word line WLj, the low-order bit (even-numbered bit line) of the word line WL(j+1), the low-order bit (odd-numbered bit line) of the word line WL(j+1), the high-order bit (even-numbered bit line) of the word line WLj, the high-order bit (odd-numbered bit line) of the word line WLj, the low-order bit (even-numbered bit line) of the word line WL(j+2), the low-order bit (odd-numbered bit line) of the word line WL(j+2), <Example of a Method for Sensing Data>

An example of a method for sensing data will be described below. FIG. 26 is a circuit diagram of the sense amplifier 20, described in the above embodiments. As shown in the figure, the sense amplifier 20 includes switching elements 120 to 123, n-channel transistors 124 to 126, a p-channel MOS transistor 127, a capacitor element 128, and a latch circuit 129. A voltage VDD is provided to one end of a current path of the MOS transistor 124 via the switching element 120. The other end of the current path is connected to a node N1, and a signal S1 is input to a gate of the MOS transistor 124. One end of a current path of the MOS transistor 125 is connected to node N1. The other end of the current path is connected to the bit line BL. A voltage VSS is provided to the MOS transistor 125 via the switching element 123, and a signal S2 is provided to a gate of the MOS transistor 125. One end of a current path of the MOS transistor 126 is connected to node N1. The other end of the current path is connected to a node N2. A signal S3 is provided to a gate of the MOS transistor 126. Node N2 is provided with voltage VDD via the switching element 121. One of two electrodes on the capacitor element 128 is connected to node N2. The other electrode is provided with voltage VSS. Voltage VDD is provided to one end of a current path of the MOS transistor 127 via the switching element 122. The other end of the current path is connected to the latch circuit 129, and a gate of the MOS transistor 127 is connected to node N2.

A brief description will be given of the method for sensing data using the above configuration. It is assumed that the memory cell has been written with a "1" data. First, the switching element 120 and the MOS transistors 124, 125, and 126 are turned on to precharge the bit line BL to about 0.65V. Nodes N1 and N2 are also precharged so that the potentials of nodes N1 and N2 become about 0.9V and about 2.5V, respectively. That is, since the memory cell transistor MT is on, the nodes are precharged with current flowing through the bit line BL.

Then, the switching element 121 is turned off. Current flowing through the bit line BL from node N2 then discharge node N2, the potential of which becomes about 0.9V. Current flowing through the bit line BL sets the potential of node N1 equal to or lower than 0.9V. However, current flowing through the MOS transistor 124 keeps the potential of node N1 at 0.9V.

Since the potential of node N2 is 0.9V, the MOS transistor 127 is turned on. Thus, the latch circuit 129 holds voltage VDD. Since the latch circuit 129 holds VDD, the switching element 120 is turned off, the switching element 123 is turned on, and the potential of node N2 is set at 0V. As a result, the latch circuit 129 continues to hold voltage VDD.

Now, description will be given of the case in which the selected memory cell has been written with a "0" data. In this case, the potential of node N2 is kept at about 2.5V. Thus, the MOS transistor 127 is turned off, and the latch circuit 129 holds voltage VSS (0V). This turns on the switching element 120, while turning off and the switching element 123. The potential of node N2 is kept at 2.5V, and the latch circuit 129 continues to hold voltage VSS.

As described above, the sense amplifier sensing the current flowing through the bit line enables data to be read from all the bit lines at a time without the need to take into account the adverse effect of a variation in the potential of the adjacent bit line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell unit in which a plurality of memory cells are connected in series, each of the memory cells including a charge accumulation layer and a control gate formed above the charge accumulation layer;
   word lines each connected to the control gate of each of the corresponding memory cells;
   a driver circuit which selects one of the word lines and applies voltages to a selected word line and unselected word lines during a data write operation and a data read operation; and
   a voltage generator which includes a first charge pump circuit and second charge pump circuits and which outputs a voltage generated by the first and second charge pump circuits to the driver circuit, the first charge pump circuit being exclusively used to generate a voltage for a first word line, the first word line being one of the unselected word lines located adjacent to the selected word line, the second charge pump circuits generating a voltage for second word lines, the second word lines being the unselected word lines which are not located adjacent to the selected word line,
   wherein the driver circuit applies a first voltage and a second voltage to the second word lines,
   the second charge pump circuits generate the first voltage and the second voltage, and
   the number of second charge pump circuits generating the first voltage and the number of second charge pump circuits generating the second voltage each varies depending on a ratio of the number of second word lines to which the first voltage is to be applied to the number of second word lines to which the second voltage is to be applied.

2. The device according to claim 1, wherein the driver circuit includes word line drivers each provided for a corresponding one of the word lines,
   the word line driver includes
   a first switch which transfers the voltage generated by the first charge pump circuit to the first word line; and a second switch which transfers the voltage generated by the second charge pump circuits to the second word lines, the first charge pump circuit generates a third voltage during the write operation and a fourth voltage during the read operation, and the first switch transfers the third voltage during the write operation and the fourth voltage during the read operation.

3. The device according to claim 1, wherein during the write operation, the first charge pump circuit generates a voltage higher than the voltage generated by the second charge pump circuits.

4. The device according to claim 1, wherein the memory cell is configured to hold multi-level data containing at least 2 bits depending on a threshold voltage, and during the read operation, the first charge pump circuit varies the generated voltage depending on a read level for the data.

5. The device according to claim 1, wherein the voltage generator further includes a limiter circuit which determines an upper limit for a voltage generated by the first charge pump circuit, the limiter circuit being used for both the write and read operations.

6. The device according to claim 1, further comprising
a bit line electrically connected to a drain of one of the memory cells positioned at one end of the memory cell unit; and
a source line electrically connected to a source of the memory cells positioned at the other end of the memory cell unit,
wherein the first word line is located adjacent to the selected word line on the bit line side.

7. The device according to claim 1, further comprising
a bit line electrically connected to a drain of one of the memory cells positioned at one end of the memory cell unit; and
a source line electrically connected to a source of one of the memory cells positioned at the other end of the memory cell unit,
wherein the first word line is located adjacent to the selected word line on the source line side.

8. The device according to claim 1, further comprising
a bit line electrically connected to a drain of one of the memory cells positioned at one end of the memory cell unit; and
a source line electrically connected to a source of one of the memory cells positioned at the other end of the memory cell unit,
wherein the first word line is located adjacent to the selected word line on the bit line side;
the first charge pump circuit is further used to generate a voltage for a third word line, and
the third word line is one of the unselected word lines located adjacent to the selected word line on the source line side.

9. The device according to claim 1, wherein the memory cell holds multi-level data containing at least 2 bits,
the data is written to the memory cell bit by bit, and
writing of bit of higher order than a lowest-order bit of the data to one of the memory cells connected to one of the word lines is performed after writing of the lowest-order bit of the data to one of the memory cells connected to the first word line located adjacent to the one of the word lines on a drain side.

10. The device according to claim 1, wherein during the data read operation, data is read from one of the unselected memory cells connected to the first word line before data is read from one of the memory cells connected to the selected word line.

11. A semiconductor memory device comprising:
a memory cell unit in which a plurality of memory cells are connected in series, each of the memory cells including a charge accumulation layer and a control gate formed above the charge accumulation layer;
word lines each connected to the control gate of each of the corresponding memory cells;
a voltage generator including a first charge pump circuit and second charge pump circuits each of which generates a voltage; and
a plurality of word line drivers each provided for a corresponding one of the word lines to apply the voltage generated by the voltage generator to the word lines, the voltage generated by the first charge pump circuit being provided to one of the word line drivers corresponding to one of unselected word lines for a data write operation and a data read operation which corresponds to one of the word lines located adjacent to a selected word line, the voltage generated by the second charge pump circuits being provided to the word line drivers corresponding to those of the unselected word lines which correspond to word lines which are not located adjacent to the selected word line,
wherein the second charge pump circuits generate and apply a first voltage and a second voltage to the word line drivers,
the word line drivers receiving the first voltage and the second voltage apply the first voltage and the second voltage to the unselected word lines which are not located adjacent to the selected word line, and
the number of second charge pump circuits generating the first voltage and the number of second charge pump circuits generating the second voltage vary depending on the number of word lines to which the first voltage and the second voltage is respectively to be applied.

12. The device according to claim 11, wherein each of the word line drivers includes
a first switch which transfers the voltage generated by the first charge pump circuit to the corresponding word lines; and
a second switch which transfers the voltage generated by the second charge pump circuits to the corresponding word lines,
the first charge pump circuit generates a third voltage during the write operation and a fourth voltage during the read operation, and
the first switch transfers the third voltage during the write operation and the fourth voltage during the read operation.

13. The device according to claim 11, wherein during the write operation, the first charge pump circuit generates a voltage higher than the voltage generated by the second charge pump circuits.

14. The device according to claim 11, wherein the memory cell is configured to hold multi-level data containing at least 2 bits depending on a threshold voltage, and
during the read operation, the first charge pump circuit varies the generated voltage depending on a read level for the data.

15. The device according to claim 11, wherein the voltage generator further includes a limiter circuit which determines an upper limit for a voltage generated by the first charge pump circuit, the limiter circuit being used for both the write and read operations.

16. The device according to claim 11, further comprising
a bit line electrically connected to a drain of one of the memory cells positioned at one end of the memory cell unit; and
a source line electrically connected to a source of one of the memory cells positioned at the other end of the memory cell unit,
wherein the voltage generated by the first charge pump circuit is provided to one of the unselected word lines which is located adjacent to the selected word line on the bit line side.

17. The device according to claim 11, further comprising
a bit line electrically connected to a drain of one of the memory cells positioned at one end of the memory cell unit; and
a source line electrically connected to a source of one of the memory cells positioned at the other end of the memory cell unit,
wherein the voltage generated by the first charge pump circuit is provided to one of the unselected word lines which is located adjacent to the selected word line on the source line side.

18. The device according to claim 11, further comprising
a bit line electrically connected to a drain of one of the memory cells positioned at one end of the memory cell unit; and
a source line electrically connected to a source of one of the memory cells positioned at the other end of the memory cell unit,
wherein the voltage generated by the first charge pump circuit is provided to two of the unselected word lines which are located adjacent to the selected word line on the bit line side and on the source line side.

19. The device according to claim 11, wherein the memory cell holds multi-level data containing at least 2 bits,
the data is written to the memory cell bit by bit, and
writing of bit of higher order than a lowest-order bit of the data to one of the memory cells connected to one of the word lines is performed after writing of the lowest-order bit of the data to one of the memory cell connected to the first word line located adjacent to one of the word lines on a drain side.

20. The device according to claim 11, wherein during the data read operation, data is read from one of the unselected memory cells connected to the first word line before data is read from one of the memory cells connected to the selected word line.

* * * * *